(12) United States Patent
Miller et al.

(10) Patent No.: US 6,651,385 B2
(45) Date of Patent: Nov. 25, 2003

(54) RETRACTABLE NON-CONTACT SENSOR SYSTEM

(75) Inventors: Bearge D. Miller, West Grove, PA (US); Gary Leigh, Kennett Square, PA (US); Michael Anderson, Lititz, PA (US); Timothy Castello, West Chester, PA (US)

(73) Assignee: Miller Edge, Inc., West Grove, PA (US)

( * ) Notice: Subject to any disclaimer, the term of this patent is extended or adjusted under 35 U.S.C. 154(b) by 66 days.

(21) Appl. No.: 09/969,403

(22) Filed: Oct. 2, 2001

(65) Prior Publication Data

US 2002/0046494 A1 Apr. 25, 2002

Related U.S. Application Data

(60) Provisional application No. 60/237,465, filed on Oct. 2, 2000.

(51) Int. Cl.$^7$ .............................................. E05F 15/08
(52) U.S. Cl. ............................................. 49/27; 49/199
(58) Field of Search ................................. 49/26, 27, 28, 49/197, 199; 200/61.43; 160/188, 189, 133

(56) References Cited

U.S. PATENT DOCUMENTS

| 1,576,950 A | * | 3/1926 | Conklin ................... 200/61.43 |
|---|---|---|---|
| 1,634,665 A | * | 7/1927 | Hedley et al. ........... 200/61.43 |
| 2,135,131 A | * | 11/1938 | Bassett ..................... 200/61.43 |
| 2,476,111 A | * | 7/1949 | Opalek .......................... 49/27 |
| 3,168,165 A | * | 2/1965 | Bagnasco ................... 187/317 |
| 3,537,211 A | * | 11/1970 | Guilbert, Jr. et al. ........... 49/27 |
| 4,301,621 A | * | 11/1981 | Houweling .................... 49/27 |
| 4,953,608 A | * | 9/1990 | Larsson ......................... 160/1 |
| 4,984,658 A | * | 1/1991 | Peelle et al. ................. 187/314 |
| 5,233,185 A | * | 8/1993 | Whitaker .................. 250/222.1 |
| 5,426,293 A |   | 6/1995 | Miller et al. |
| 5,596,840 A | * | 1/1997 | Teich .............................. 49/26 |
| 5,602,370 A | * | 2/1997 | Kau ......................... 200/61.43 |
| 5,625,980 A | * | 5/1997 | Teich et al. ..................... 49/26 |
| 5,728,984 A |   | 3/1998 | Miller |
| 5,743,320 A | * | 4/1998 | McKeon ...................... 160/310 |
| 5,832,665 A |   | 11/1998 | Miller et al. |
| 5,929,406 A | * | 7/1999 | Thile ........................ 200/61.43 |
| 5,962,825 A |   | 10/1999 | Miller |
| 6,082,046 A | * | 7/2000 | Simmons ........................ 49/26 |
| 6,176,039 B1 | * | 1/2001 | Craig .............................. 49/26 |

FOREIGN PATENT DOCUMENTS

| EP | 0 284 066 | * | 3/1988 | |
|---|---|---|---|---|
| GB | 451936 | * | 8/1936 | ..................... 49/27 |

* cited by examiner

Primary Examiner—Gregory J. Strimbu
(74) Attorney, Agent, or Firm—Akin Gump Strauss Hauer & Feld, L.L.P.

(57) ABSTRACT

A non-contact sensor system controls movement of a door moving in a first direction by actuation of a device. The system includes a transmitter extending a predetermined distance beyond a leading edge of the door at a first door end for transmitting a signal toward a second door end. The transmitter is attached to the door by a first moveable member which is capable of engaging a surface when the door closes and moving to a retracted position. The sensor system further includes a receiver extending a predetermined distance beyond the leading edge of the door at the second door end in alignment with the transmitter for detecting the signal, and for generating an output signal when the signal is blocked. The receiver is attached to the door by a second moveable member which is capable of engaging the surface when the door closes and moving to the retracted position.

17 Claims, 13 Drawing Sheets

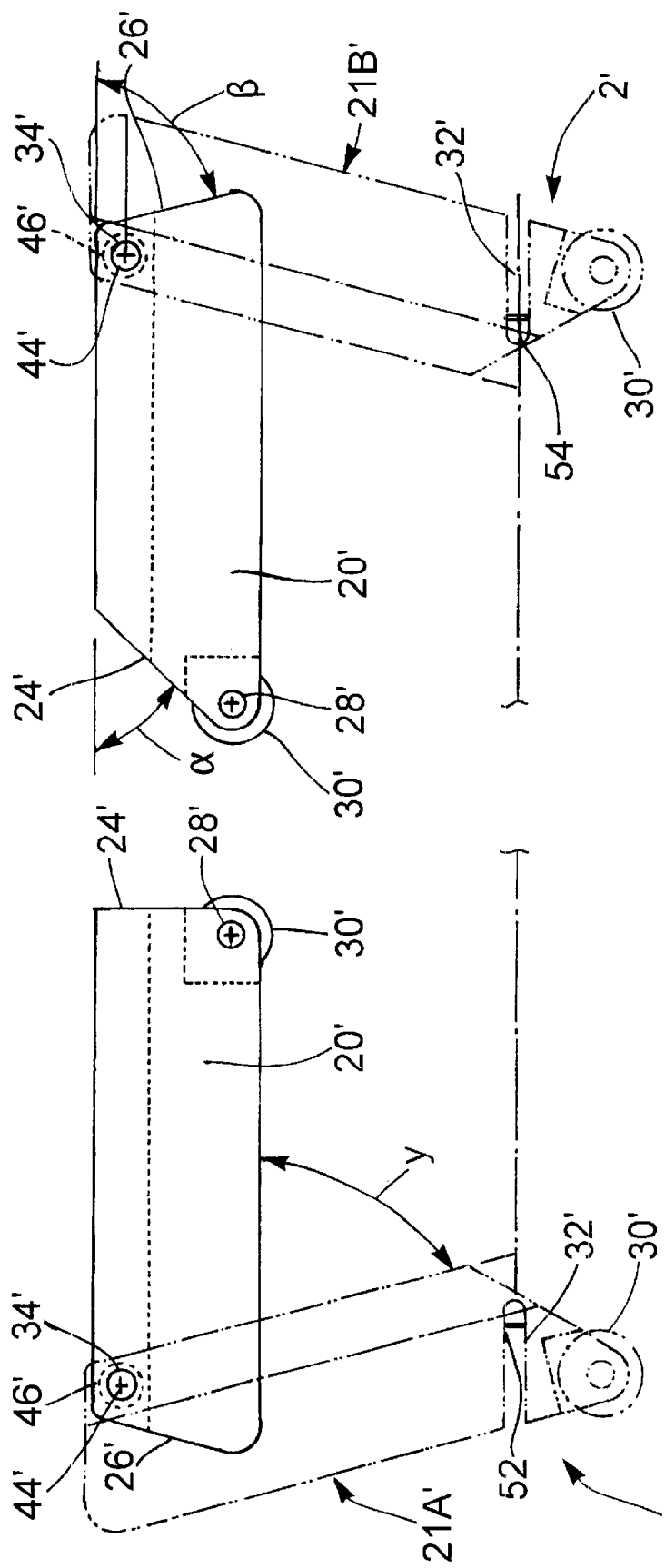

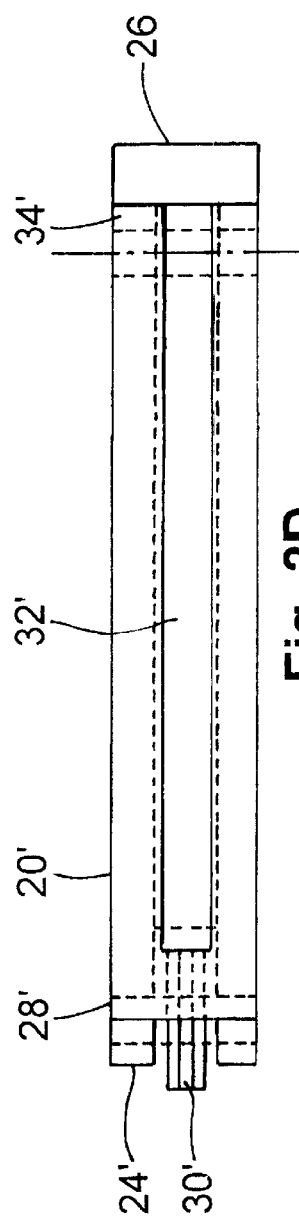
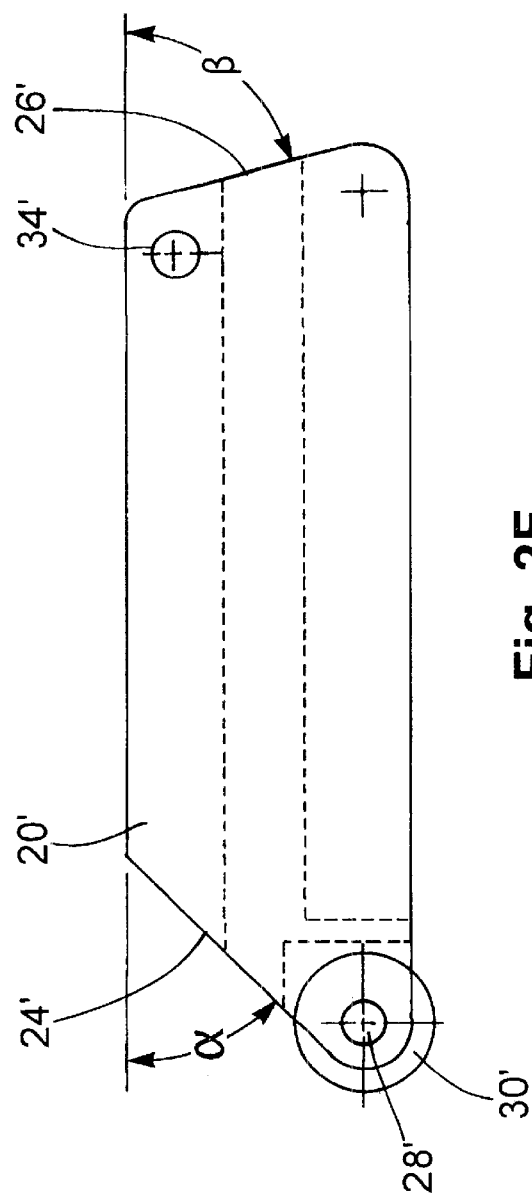
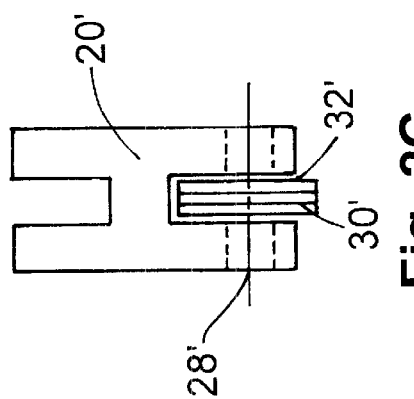

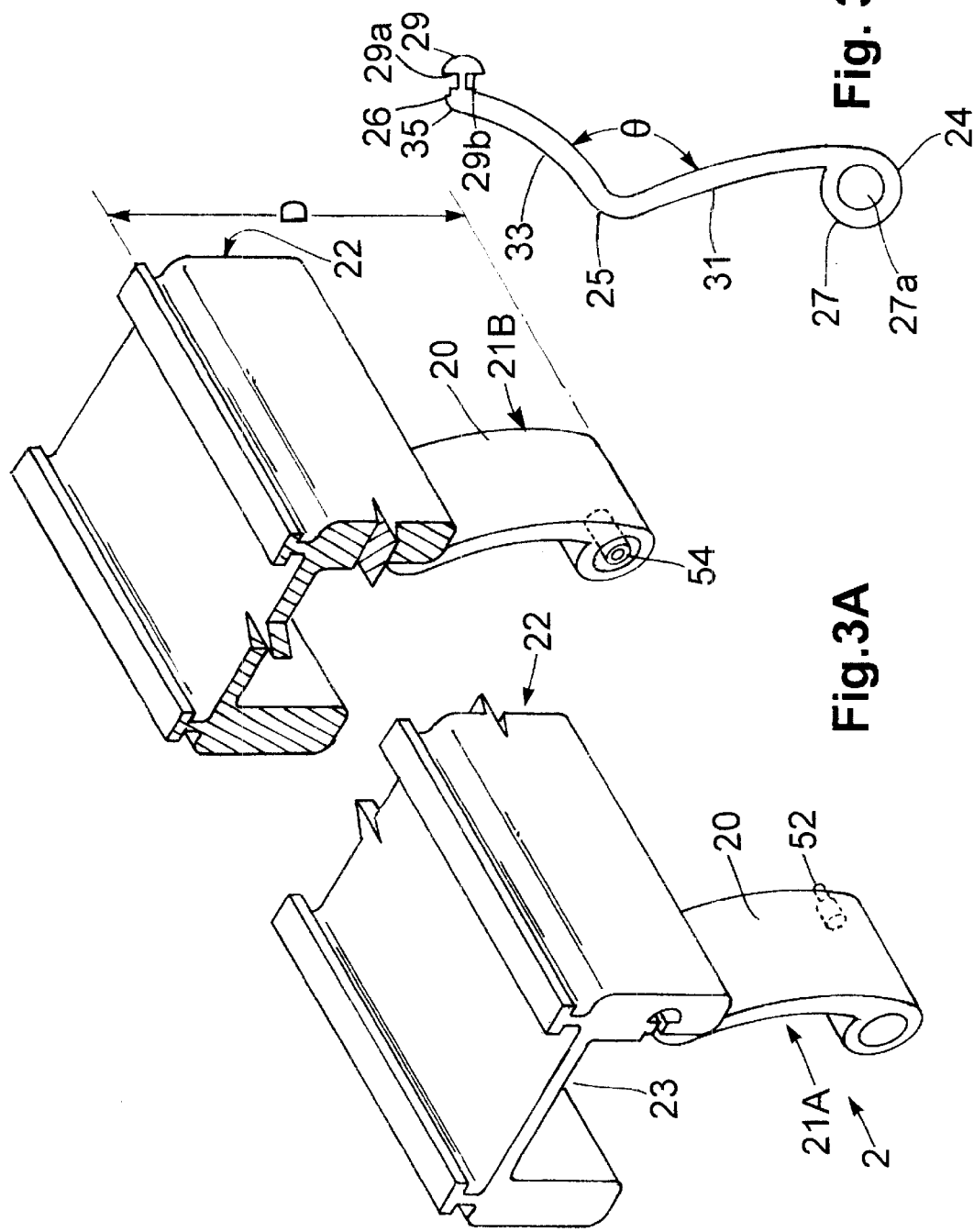

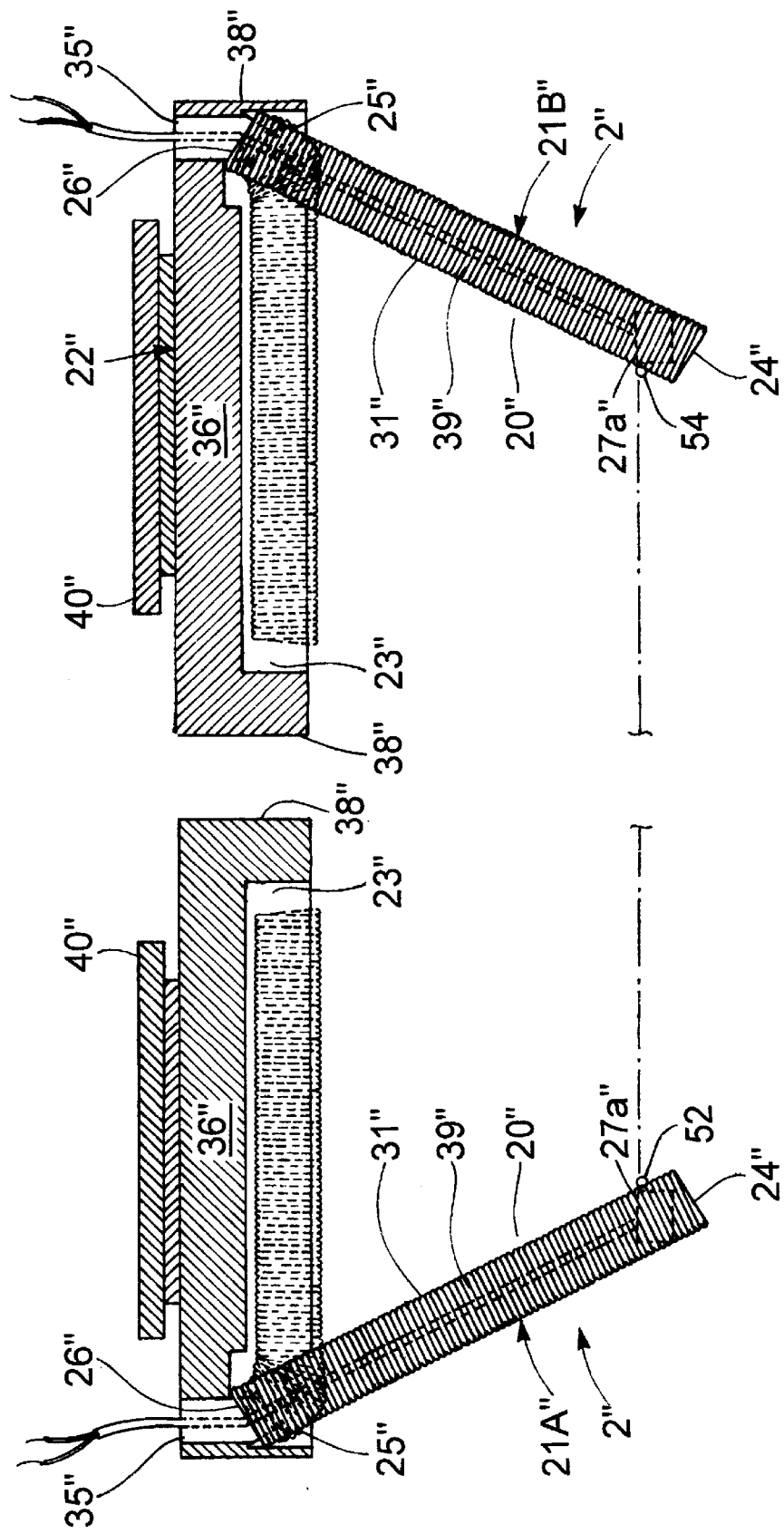

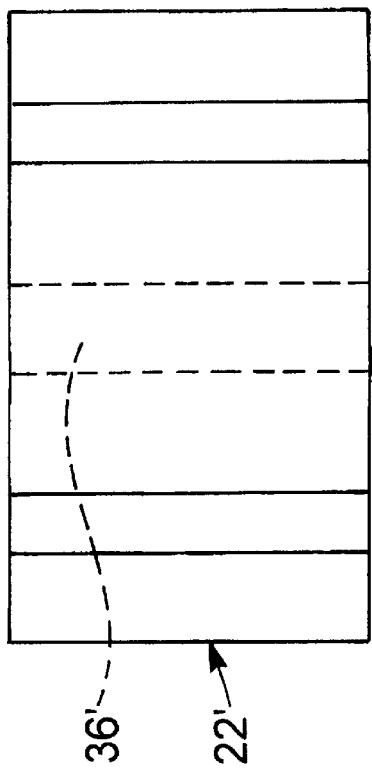
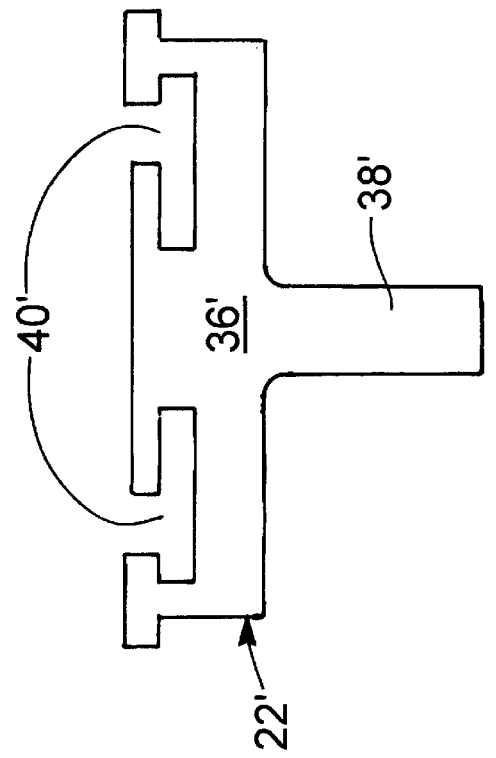
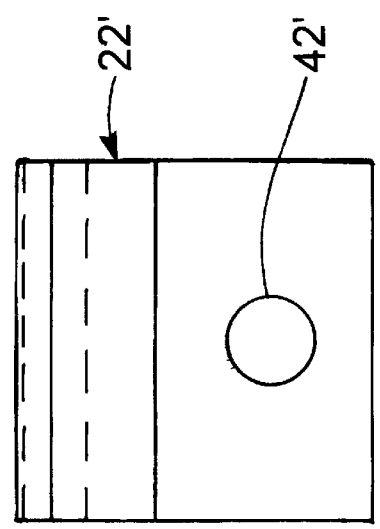

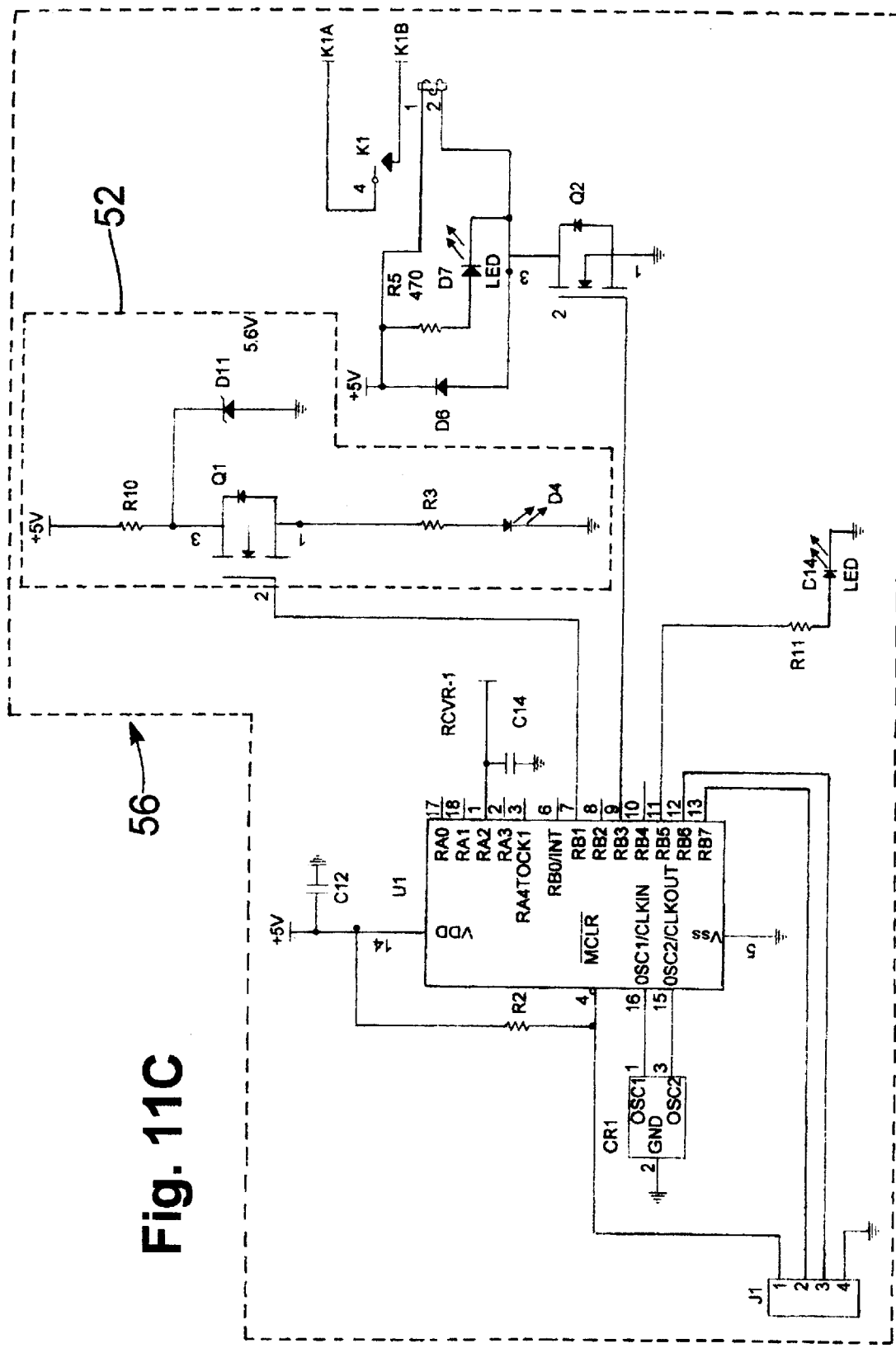

RETRACTABLE NON-CONTACT SENSOR SYSTEM

CROSS-REFERENCE TO RELATED APPLICATIONS

This application claims the benefit of U.S. Provisional Application No. 60/237,465 entitled "NON-CONTACT SENSOR SYSTEM," filed Oct. 2, 2000.

BACKGROUND OF THE INVENTION

The present invention relates to a sensor system for controlling movement of a door or other moving structure and, more particularly, a non-contact sensor system having a transmitter and a receiver with a control circuit for controlling movement of an overhead door or other moving structure.

Devices used for controlling the movement, particularly the downward movement of a door, such as an overhead door, are well known in the art. The following patents, the subject matter of which are hereby incorporated herein by reference, relate to sensing edges for use with such a door:

U.S. Pat. No. 5,426,293 entitled "Sensing Edge Having A Photoelectric Switch Position Therein"

U.S. Pat. No. 5,728,984 entitled "Sensing Safety Edge Systems"

U.S. Pat. No. 5,832,665 entitled "Sensing Edge" and

U.S. Pat. No. 5,962,825 entitled "Universal Sensing Edge".

In addition, the use of an electric eye positioned near the floor on either side of such a door for the purpose of controlling downward movement of such a door is generally well known in the art.

While the prior art methods for controlling the downward movement of a door all function adequately, there is a need for a more advanced non-contact sensor system for controlling the movement of a door which is not necessarily located proximate to the floor or closing surface. In this manner, movement of the door can be controlled to prevent damage to the door or to other devices, such as the prongs of a forklift, which may be positioned within the path of the door, but not necessarily proximate to the floor. Prior art sensing edges required that the object actually contact or touch the edge to create pressure or to occlude an infrared or other signal in a sheath thereby allowing the door to come into contact with the object. The present invention provides such a non-contact sensor system for a door which extends beyond a leading edge of the door and moves with the door, and which functions to sense the presence of items in the path of a downwardly moving door over substantially the entire range of movement of the door and prevent the door from ever contacting the sensed items.

BRIEF SUMMARY OF THE INVENTION

Briefly stated, the present invention comprises a non-contact sensor system that controls movement of a door moving in a first direction by actuation of a device. The sensor system includes a transmitter extending a predetermined distance beyond a leading edge of the door at a first door end for transmitting a signal toward a second door end. The transmitter is attached to the door by a first moveable member which is capable of engaging a surface when the door closes and moving to a retracted position. The sensor system further includes a receiver extending a predetermined distance beyond the leading edge of the door at the second door end in relative alignment with the transmitter for detecting the signal, and for generating an output signal when the signal is blocked. The receiver is attached to the door by a second moveable member which is capable of engaging the surface when the door closes and moving to the retracted position. The output signal is suppressed when the second moveable member is in the retracted position.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 2A is a side elevation view of a rotating channel member that includes an infrared transmitter in accordance with a second preferred embodiment of the present invention;

FIG. 2B is a side elevation view of a rotating channel member that includes an infrared receiver in accordance with a second preferred embodiment of the present invention;

FIG. 2C is a front elevation view of a portion of a rotating channel member employed in the system shown in either FIGS. 2A or 2B;

FIG. 2D is a top plan view of a rotating channel member employed in the system shown in either FIG. 2A or 2B;

FIG. 2E is an enlarged side elevation view of a rotating channel member employed in the system shown in either FIGS. 2A or 2B;

FIG. 3A is a perspective view of a pair of foldable channel members that include an infrared transmitter and an infrared receiver in accordance with a first preferred embodiment of the present invention;

FIG. 3B is a side elevation view of a foldable channel member employed in the system shown in FIG. 3A;

FIG. 4A is a side elevation view of a bendable channel member that includes an infrared transmitter in accordance with a third preferred embodiment of the present invention;

FIG. 4B is a side elevation view of a bendable channel member that includes an infrared receiver in accordance with a third preferred embodiment of the present invention;

FIG. 6 is a top plan view of an embodiment of a support member used for securing the rotating channel member of FIGS. 2A and 2B to the leading edge of a door;

FIG. 7 is a side elevational view of the support member of FIG. 6;

FIG. 8 is a front elevational view of the support member of FIG. 6;

FIG. 11C is a schematic circuit diagram of a control circuit for a sensor system in accordance with a preferred embodiment of the present invention.

DETAILED DESCRIPTION OF THE INVENTION

Figure 1:
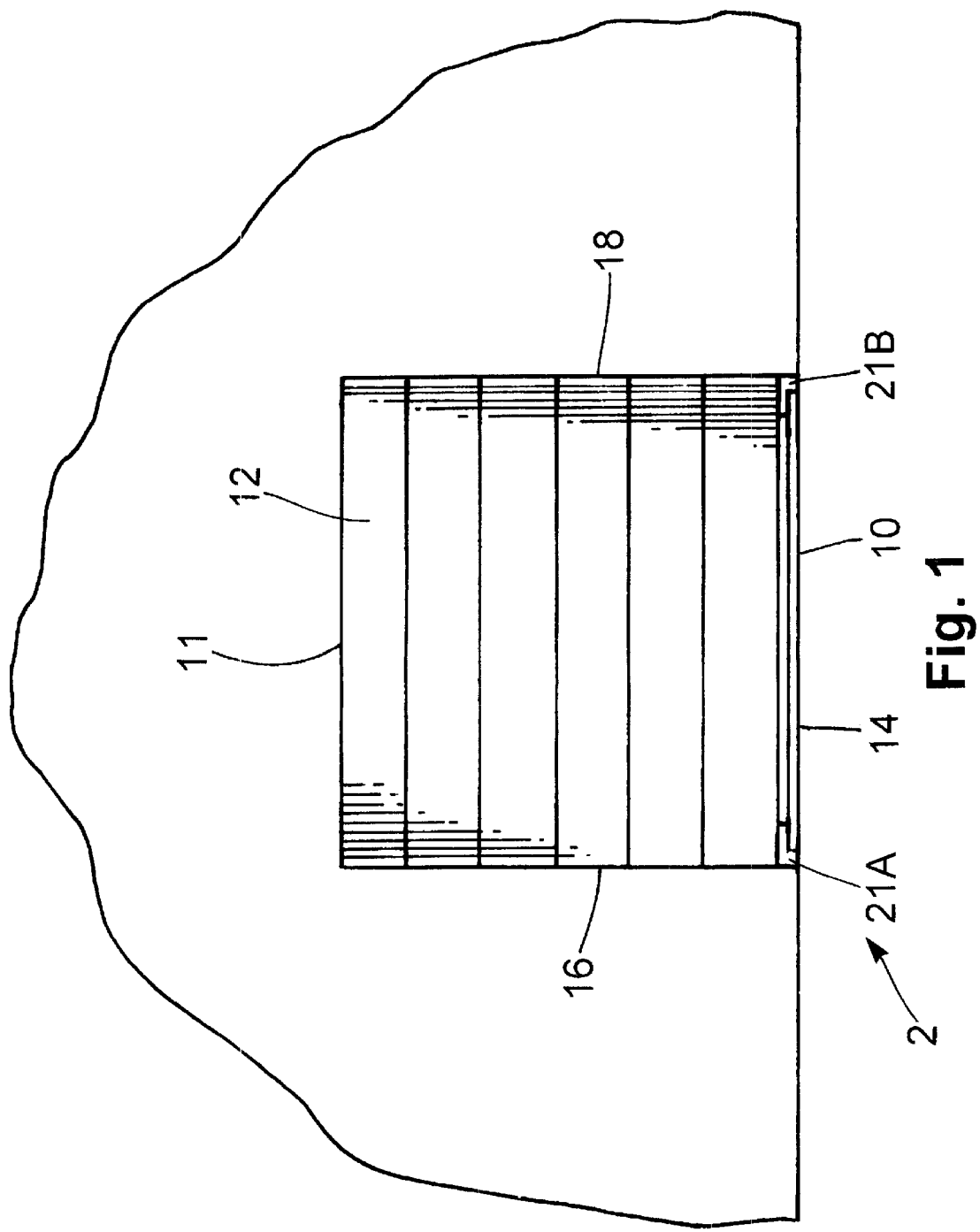
FIG. 1 is a front elevational view of a door construction, including a non-contact sensor system in accordance with a preferred embodiment of the present invention.

Referring to the drawings in detail, wherein like numerals indicate like elements throughout the several figures, there is shown in FIG. 1 a first preferred embodiment of a non-contact sensor system 2 in accordance with the present invention. The non-contact sensor system 2 is employed to function with an existing actuator device or door controller 50 (FIG. 9) to cause a closing overhead door 12 or other structure to stop closing, to open or to move to a safe position when the non-contact sensor system 2 senses the presence of an object (not shown) within the path of the door 12. The non-contact sensor system 2 preferably causes the door 12 to stop before the door 12 contacts the object within the path of the door 12. The device 50 includes a limit switch 55 for detecting when the door 12 is in a nearly completely closed position. As shown in FIG. 1, a doorway 11 is provided with the door 12 which, in the present embodiment is an overhead door, but need not be. The door 12 opens or closes under the control of the device 50. In the presently preferred embodiment, a sensing edge 10 is secured to a leading edge 14 of the door 12. The sensing edge 10 of the type described in the above-referenced patents or can be of any other suitable type. The non-contact sensor system 2 of the present invention can be used in place of a sensing edge 10, or in combination with a sensing edge 10. The non-contact sensor system 2 can also be used in connection with movable structures other than a door 12 such as a gate.

The mechanical aspects of several embodiments of the non-contact sensor system of the present invention are illustrated in FIGS. 2A–8. As illustrated in FIG. 3A, a non-contact sensor system 2 controls movement of the door 12 moving in a first direction by actuation of the device 50. The sensor system 2 includes an emitter or transmitter 52 (hereinafter, "transmitter") extending a predetermined distance D beyond a leading edge 14 of the door 12 at a first door end 16 (FIG. 1) for transmitting a signal (not shown) toward a second door end 18 (FIG. 1). The transmitter 52 may be an infrared emitter, a light emitting diode (LED) or the like. The transmitter 52 is attached to the door 12 by a first moveable member 21A. The first moveable member 21A is capable of engaging an underlying surface (not shown) such as the ground or an overlying floor when the door 12 closes and moving to a retracted position. The sensor system 2 further includes a receiver 54 extending a predetermined distance D beyond the leading edge 14 of the door 12 at the second door end 18 and in relative alignment with the transmitter 52 for detecting the transmitted signal, and for generating an output signal (not shown) when the transmitted signal is not received because it is blocked. The receiver 54 is attached to the door 12 by a second moveable member 21B. The second moveable member 21B is capable of engaging the underlying surface when the door 12 closes and moving to a retracted position. The device 50 detects when the door 12 is nearly completely closed by the limit switch 55 which is mounted separately on the door 12 or device 50 from the moveable members 21A, 21B. The output signal is suppressed when the second moveable member 21B is in the retracted position. The retracted position is determined by the limit switch 55. Limit switch 55 may be an electromechanical limit switch, an inductive or capacitive proximity switch, a position transmitter with adjustable trip settings, or the like. In the present embodiment, a support member 22 (FIG. 5) includes a recess 23 proximate the first and second door ends 16, 18 and the first and second moveable members 21A, 21B move into the recess 23 as the door 12 closes to establish the retracted position. In an alternate of the present embodiment, the foldable channel members are attached directly to the door 12, and the recess is directly in the door 12. The door 12 need not have a recess 23.

Figure 5:
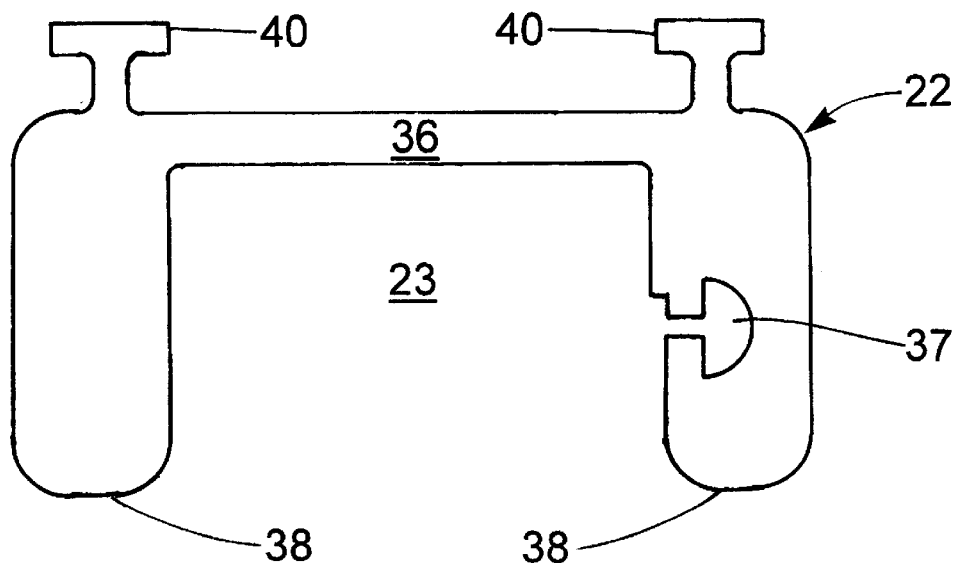
FIG. 5 is a side elevation view of a preferred embodiment of a support channel used for securing the foldable channel members of FIGS. 3A and 3B.

In the first preferred embodiment, the first and second moveable members 21A, 21B each include a foldable channel member 20. The foldable channel members 20 are structurally identical and are formed of a resilient, flexible material that folds into the recess 23 in the leading edge 14 of the door 12. The resilient material may be molded or extruded polymeric material such as polyvinyl chloride (PVC), polyethylene, high density polyethylene (HDPE), polypropylene, neoprene or the like, but the resilient material need not be polymeric. The resilient material may be other materials. As shown in FIG. 3B, each foldable channel member 20 has a first end 24 and a second end 26. The foldable channel member 20 further includes a flair 27, a first elongated section 31, a knee joint 25, a second elongated section 33, a right angle 35 and a tongue 29. The flair 27 is located proximate the first end 24 and may be generally rectangularly shaped, geometrically shaped, or the like, but is preferably cylindrically shaped, and is intended to contact the underlying surface during a normal closing operation of the door 12. The flair 27 has a cavity 27a for housing either a transmitter 52 or receiver 54. The first elongated section 31 extends from a portion of the flair 27 in a first curvilinear form with a first variable width to the knee joint 25. The second elongated section 33 extends from the knee joint 25 in a second curvilinear form with a second variable width to the right angle 35 proximate the second end 26. The knee joint 25 has an inner angle θ measured between the first section 31 and the second section 33. The inner angle θ may between about 20° and about 90°, but is preferably about 30°. The first curvilinear form and variable width, the second curvilinear form and variable width and the inner angle θ are all selected in order to provide the foldable channel member 20 with a predisposition to fold onto itself. Other design criteria may also affect the selection of respective lengths, widths and or configurations of the first and second sections 31, 33 and inner angle θ. The criteria include a width of the door 12, a braking distance of the door 12, and the like. The tongue 29 extends from right angle 35 for mounting the foldable channel member 20 directly to the door 12 or to the support member 22 (FIG. 5). The tongue 29 may be of a keyed shape such as a half moon shape, or the like, having first and second tongue slots 29a, 29b for mechanically mating with a similar but complimentary shaped groove 37 in the support member 22.

The support member 22 is illustrated in FIG. 5. The support member 22 is comprised of a generally flat base 36, a pair of downwardly extending leg members 38 and a pair of upwardly extending channels 40. The channels 40 are employed for securing the support member 22, either directly or indirectly, to the leading edge 14 of a door 12 in a manner well known to those of ordinary skill in the art. The downwardly extending legs 38 form a recess 23 therebetween that receives the foldable channel members 20 as the door 12 closes against the underlying surface. One of the downwardly extending legs 38, includes the groove 37 for receiving the tongue 29 of the foldable channel member 29 as described above.

Figure 3C:
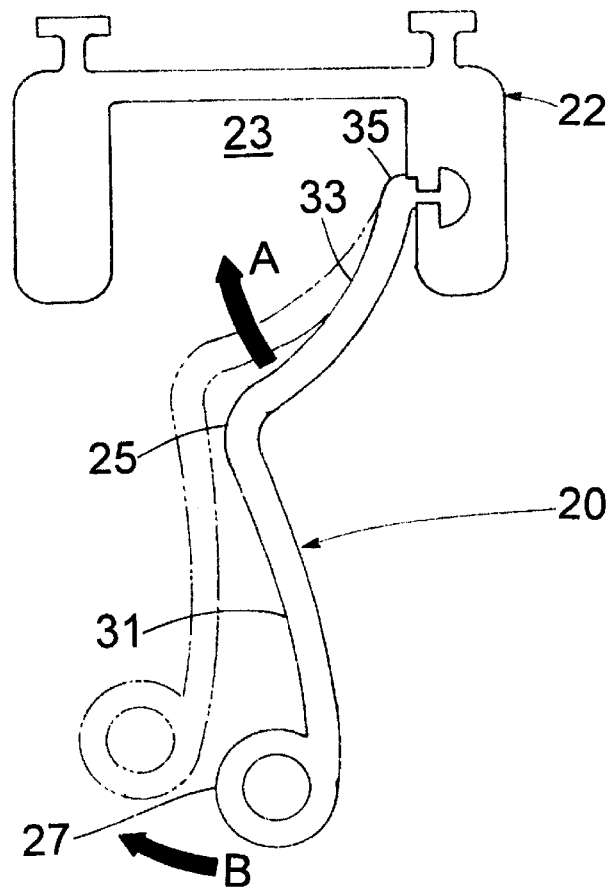
FIG. 3C is a side elevation view of a foldable channel member mounted in a support employed in the system shown in FIG. 3A.
Figure 3D:
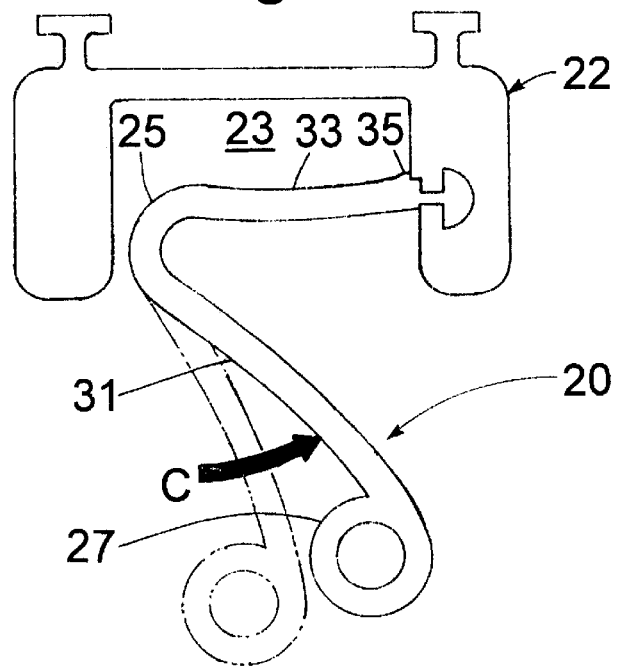
FIG. 3D is a side elevation view of the foldable channel member of FIG. 3C in a folded position.

Referring to FIGS. 3C and 3D, when the foldable channel member 20 is in the extended position, as shown by solid lines in FIG. 3C, gravity and the resiliency of the material used acts upon the foldable channel member 20 to bias the foldable channel member 20 in the extended position. As the door 12 closes, the flair 27 contacts the underlying surface proximate the first end 24 forcing the flair 27 and the first section 31 to move in a direction of directional arrow B which simultaneously forces the second section 31 to move in a direction of directional arrow A until the second section 33 reaches a position substantially in the recess 23 and where the opposing force of the right angle 35 limits further travel of the second section 33. As the door 12 continues to close, the first section 31 moves in a direction of directional arrow C (FIG. 3D) toward the retracted position substantially in the recess 23 and approximately parallel with the second section 33. When the door 12 begins to open, once again gravity and the resilient nature of the material biases the foldable channel member 20 toward the extended position causing the foldable channel member 20 to unfold in an opposite fashion.

In some applications, it may be desirable to change a length of the foldable channel members 20 to account for such variables as braking distance, speed of the door, and the like. In an application in which the braking distance of the door 12 is a known distance, the length of the channel members 20 should be such that there is sufficient time/distance for the door to come to a complete stop before reaching the point at which the signal from the transmitter 52 to the receiver 54 is broken. It is preferable that the door 12 to never contact the object which breaks the signal. Thus, the length of the channel members 20 preferably extends at least the known distance beyond the leading edge 14 of the door 12 so that the door 12 does not strike the object which broke the signal. Adjusting the length of the foldable channel members 20 may be accomplished in many ways including making extensible sections for the foldable channel members 20 to allow telescoping adjustment of each section, changing the angle θ, or making the sections of the foldable channel members 20 in two pieces with the pieces being moveably secured together using a slot/bolt arrangement or some other arrangement.

In the present embodiment, the first moveable member 21A includes a transmitter 52 for establishing a signal which extends between the two aligned moveable members 21A, 21B when the moveable members 21A, 21B are in the extended position as illustrated in FIG. 3A. The second moveable member 21B includes a receiver 54. It will be appreciated by those of ordinary skill in the art that the location of the transmitter 52 and the receiver 54 could be reversed, if desired. The important feature is that the signal extends between the transmitter 52 and the receiver 54 and thus between the aligned first and second moveable members 21A, 21B so that as the door 12 moves toward the surface, any object in the path of the leading edge 14 of the door 12 breaks or occludes the signal to thereby stop the movement of the door 12 before the door 12 or the sensing edge 10 comes into actual contact with the object.

In a second preferred embodiment, as illustrated in FIGS. 2A–2E, a non-contact sensor system 2' includes a first moveable member 21A' and a second moveable member 21B' which are structurally the same and are located on opposite ends 16, 18 of the door 12. Accordingly, only one of the moveable members 21A', 21B' will be described below. Each moveable member 21A', 21B' includes a rotating channel member 20' which is pivotally secured to a support member 22' (FIGS. 6–8) for rotation between an extended position and a retracted position. The rotating channel member 20' includes a first end 24' with an angle α that is between about 30° and 60°, but is preferably about 45°, and a second end 26' with an angle β that is between about 60° and 90°, but is preferably about 75°. The lower or distal portion of the first end 24' of the rotating channel member 20' includes a circular opening extending completely therethrough for receiving a pin member 28' which serves as an axle for supporting a wheel 30' which extends within a channel 32' of the rotating channel member 20'. The second end 26' of the channel member includes an opening 34' which is employed for pivotally supporting the rotating channel member 20' on the support member 22'. The rotating channel member 20' and the pin member 28' are preferably formed of a rigid, lightweight material, such as PVC, HDPE, Aluminum or the like. It will also be appreciated that the rotating channel member 20' may be made of a less rigid, more flexible material such as rubber, neoprene or the like. In this manner the rotating channel member 20' is less likely to damage an object which it may engage during movement of the door 12 or that might engage the rotating channel member 20' while the door 12 is open. The wheel 30', as illustrated in FIG. 2C is preferably formed of three flat washers to add weight to the distal end 24' of the channel member 20'. However, the wheel 30' could be formed of a single polymeric member or of any other suitable material. Details of the rotating channel member 20' as set forth in FIGS. 2C–2E and details of the support member 22' as set forth in FIGS. 6–8 are only for the purpose of illustrating the configuration of the second preferred embodiment and should not be considered to be a limitation of the present invention.

The support member 22' is illustrated in FIGS. 6–8. The support member 22' is comprised of a generally flat base 36', a downwardly extending leg member 38' and a pair of upwardly extending channels 40'. The channels 40' are employed for securing the support member 22', either directly or indirectly, to the leading edge 14 of a door 12 in a manner well known to those of ordinary skill in the art. The downwardly extending leg 38', includes an opening 42' which is employed for receiving a pin member 44' for pivotally connecting the rotating channel member 20' to the support member 22' as illustrated in FIGS. 2A and 2B. When the rotating channel member 20' is pivotally secured to the support member 22', a coil spring 46' is installed around the pin member 44' and within the channel 32'. The purpose of the coil spring 46' is to bias or urge the rotating channel member 20' toward the extended position as shown in phantom in FIGS. 2A and 2B. When the rotating channel member 20' is in the extended position as shown in phantom in FIGS. 2A and 2B, the second end 26' limits movement of the channel member 22' to an angle γ of between about 60° and about 90°, but preferably to approximately 75° with respect to the leading edge 14 of the door 12. If a sensing edge 10 is secured to the leading edge 14 of the door 12, a portion of the sheath (not shown) of the sensing edge is removed to permit the rotating channel member 20' to pivot into the retracted position as shown in solid in FIGS. 2A and 2B. If the door 12 does not include a sensing edge 10 then an opening is provided in a weather seal, forming a recess (not shown) along the leading edge 14 of the door 12 for receiving the rotating channel member 20' when in the retracted position. The support member 22' is preferably made of a rigid lightweight material, such as aluminum. However, a polymeric material may alternatively be employed.

FIGS. 2A and 2B illustrate a non-contact sensor system 2' in accordance with the present invention, which includes a pair of generally aligned moveable members 21A', 21B' of the type described above which are secured proximate the first door end 16 and the second door end 18 of the leading edge 14 of a door 12 (not shown in FIGS. 2A and 2B) and are oriented so that the channels 32' are aligned and facing each other. As can be appreciated from the foregoing description and from FIGS. 2A and 2B, as the door 12 moves from an open position toward a closed position, eventually the wheels 30' engage the underlying surface causing the moveable members 20' to pivot from the extended position as illustrated in phantom in FIGS. 2A and 2B to the retracted position as illustrated with solid lines in FIGS. 2A and 2B. When the first and second moveable members 21A', 21B' are in the retracted position, the first and second moveable members 21A', 21B' are effectively encased within the distal ends of the sheath of any sensing edge 10 secured to the leading edge 14 of the door 12 or, if no sensing edge is employed, within the weather seal secured to the leading edge 14 of the door 12. As the door 12 is opened, the coil springs 46' and the force of gravity urge the channel members 20' to pivot back to the extended position as illustrated in phantom in FIG. 2B.

In the present embodiment, the first moveable member 21A' includes a transmitter 52 for establishing a signal which extends between the two aligned moveable members 21A', 21B' when the moveable members 21A', 21B' are in the extended position as illustrated in phantom in FIG. 2A. The second moveable member 21B' includes a receiver 54. It will be appreciated by those of ordinary skill in the art that the location of the transmitter 52 and the receiver 54 could be reversed, if desired. The important feature is that the signal extends between the transmitter 52 and the receiver 54 within the two aligned moveable members 21A', 21B' so that as the door 12 moves downwardly, any object in the path of the door 12 breaks the signal and, thereby, stops the movement of the door 12 toward the surface before the door 12 comes into contact with the object.

It will be appreciated that the rotatable channel members 20' may be oriented in a manner which differs from the orientation shown in FIGS. 2A and 2B. For example, the rotatable channel members 20' could each be rotated ninety degrees so that the rotatable channel members 20' are aligned with each other, but are both perpendicular to the principal surface of the door 12 and thus, extend into a facility. Of course, if the orientation of the channel members 20' is changed from that shown in FIGS. 2A and 2B, the orientation or location of the transmitter 52 and receiver 54 may also have to be changed to establish the signal between the first and second moveable members 21A', 21B'. In addition, the connection between the rotatable channel members 20' and the support members 22' may be adjustable to facilitate a different orientation of the channel members 20'.

In some applications, it may be desirable to change the length of the rotatable channel members 20' to account for such variables as braking distance, speed of the door, and the like. In an application in which the braking distance of the door 12 is a known distance, the length of the channel members 20' should be such that there is sufficient time/distance for the door 12 to come to a complete stop before reaching the point at which the signal from the transmitter 52 to the receiver 54 is broken. It is preferable that the door 12 to never contact the object which breaks the signal. Thus, the length of the channel members 20' preferably extends at least the known distance beyond the leading edge 14 of the door 12, so that the door 12 does not strike the object which broke the signal. Adjusting the length of the rotating channel members 20' may be accomplished in many ways including making telescoping rotating channel members 20' or making the rotating channel members 20' in two pieces with the pieces being moveably secured together using a slot/bolt arrangement or some other arrangement.

In order to facilitate alignment of the transmitter 52 and the receiver 54, the first moveable member 21A' may be moveably attached to the second moveable member 21B' by a connecting rod and a pivot or swivel joint or similar mechanical connection.

In a third preferred embodiment, illustrated in FIGS. 4A and 4B, the first and second moveable members 21A", 21B" each include a bendable channel member 20". The bendable channel members 20" are structurally identical and have a coil spring housing 39" that bends into a recess 23" in the leading edge 14 of the door 12. The coil spring housing 39" may be constructed of resilient material such brass, steel, hard rubber or the like, but the resilient material may be other materials. FIGS. 4A and 4B demonstrate that each bendable channel member 20" has a first end 24" and a second end 26". The bendable channel member 20" further includes an elongated section 31", a bending joint 25", and an attachment angle 35". The elongated section 31" may be generally rectangularly shaped, geometrically shaped, or the like, but is preferably cylindrically shaped, and is intended to contact the surface at least at the first end 24" during a normal closing operation. The housing 39" has a cavity 27a" for housing either the transmitter 52 or receiver 54. The first elongated section 31" includes the bending joint 25" whose location is determined by an overall length of the bendable channel member 20", a length and degree of bend of the attachment angle 35" and a stiffness of the material of the housing 39". The attachment angle 35" is for mounting the bendable channel member 20" directly to the leading edge 14 of the door 12 or to a support member 22". The attachment angle 35" may be threaded or grooved for attachment with nuts or snap-rings, but may utilize other known attachment mechanisms.

The support member 22" is comprised of a generally flat base 36", a pair of downwardly extending leg members 38" and a pair of upwardly extending channels 40". The channels 40" are employed for securing the support member 22", either directly or indirectly, to the leading edge 14 of a door 12 in a manner well known to those of ordinary skill in the art. The downwardly extending legs 38" form a recess 23" that receives the bendable channel member 20" as the door 12 closes against the surface. When the bendable channel member 20" is in the extended position, as shown by solid lines in FIGS. 4A and 4B, the coil spring housing 39" biases the bendable channel member 20" to the extended position. As the door 12 closes, the first end 24" contacts the support, forcing the elongated section 31" to bend at the bending joint 25" in a direction toward the recess 23" until the elongated section 31" reaches the retracted position which is substantially in the recess 23" as shown in phantom in FIGS. 4A and 4B. When the door 12 begins to open, the coil spring housing 39" biases the bendable channel member 20", once again toward the extended position.

In some applications, it may be desirable to change the length of the foldable channel members 20" to account for such variables as braking distance, speed of the door, and the like. In an application in which the braking distance of the door 12 is a known distance, the length of the channel members 20" should be such that there is sufficient time/distance for the door to come to a complete stop before the door reaches the point at which the transmitted signal is broken. It is preferable that the door 12 to never contact the object which breaks the signal. Thus, the length of the channel members 20" preferably extends at least the known distance beyond the leading edge 14 of the door 12 so that the door 12 does not strike the object which broke the signal. Adjusting the length of the bendable channel members 20" may be accomplished in many ways including making stackable or threaded sections of the bendable channel members 20" to accommodate extension pieces or making the bendable channel members 20" in telescoping pieces with the pieces being moveably secured together using a set screw arrangement or some other arrangement.

Figure 9:
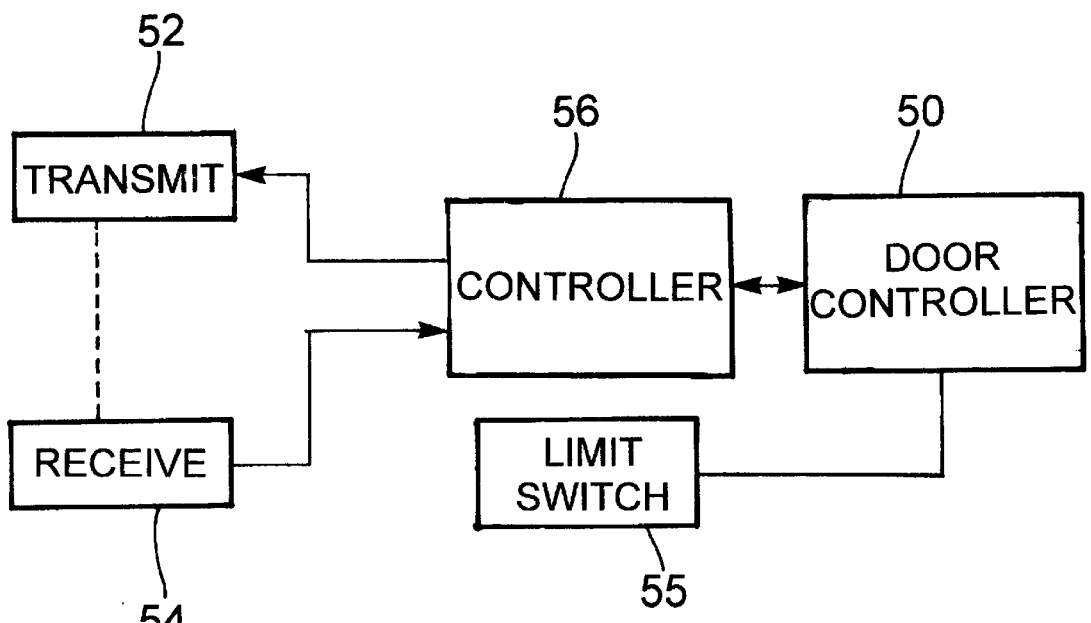
FIG. 9 is functional block diagram schematic of the electronics employed in the preferred embodiment of the non-contact sensor system.

FIGS. 10A–11C illustrate preferred embodiments of the electronics of the present system. As shown in FIG. 9, the transmitter 52 and the receiver 54 are electrically connected to a controller 56, which in turn is electrically connected to the device or door controller 50. The controller 56 includes circuitry for generating an appropriate transmit signal which is sent to the transmitter 52, as well as circuitry for receiving electrical signals from the receiver 54. In the preferred embodiment, the transmitter 52 is an infrared transmitter for transmitting an infrared signal and the receiver 54 is an infrared receiver for detecting infrared signals. However, other technologies may be used instead of infrared, such as microwave, radio wave, visible light, laser beam and the like, without departing from the broad scope of the invention.

Figure 11A:
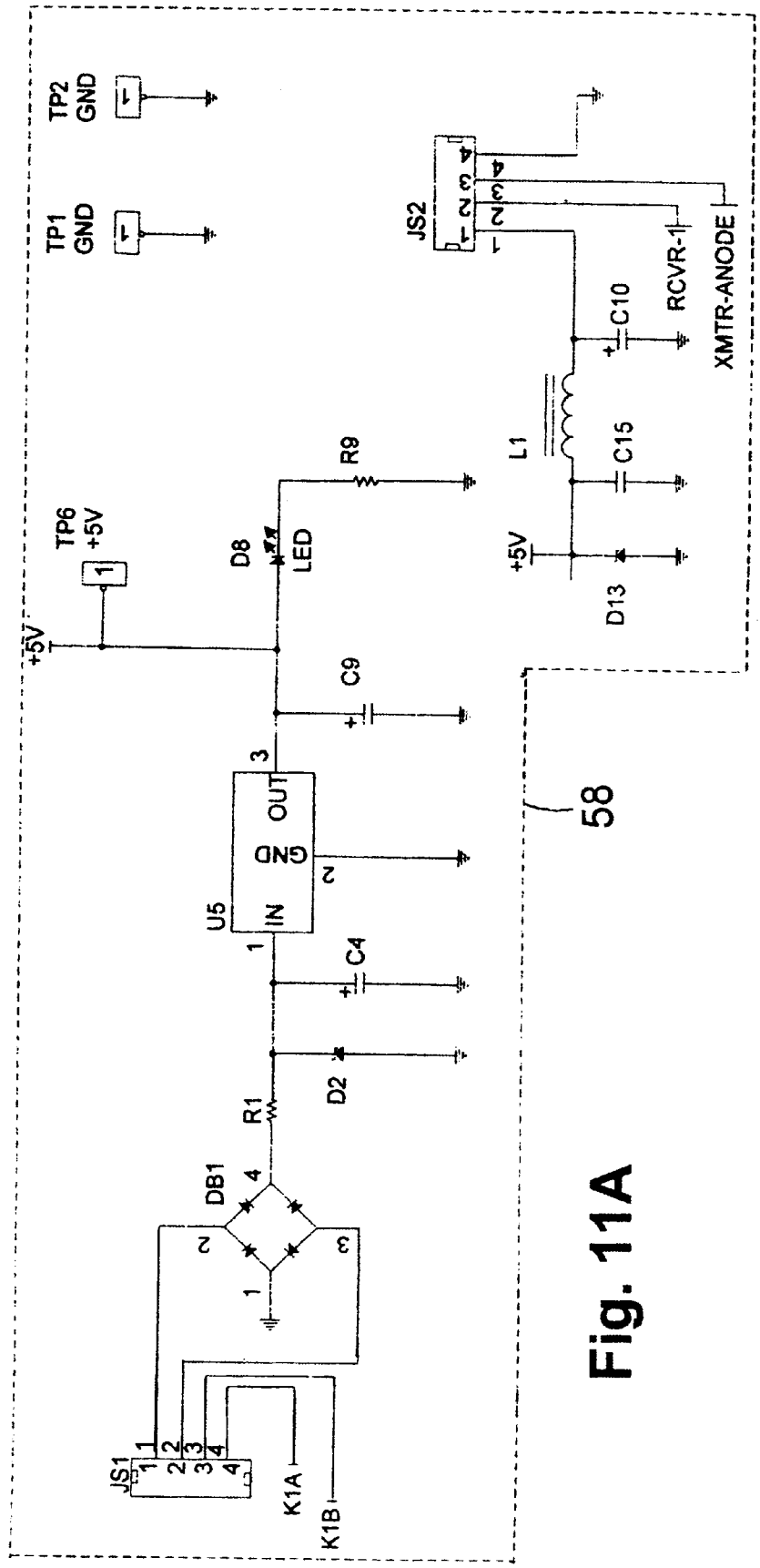
FIG. 11A is a schematic circuit diagram of a power supply circuit for a sensor system in accordance with a preferred embodiment of the present invention.
Figure 11B:
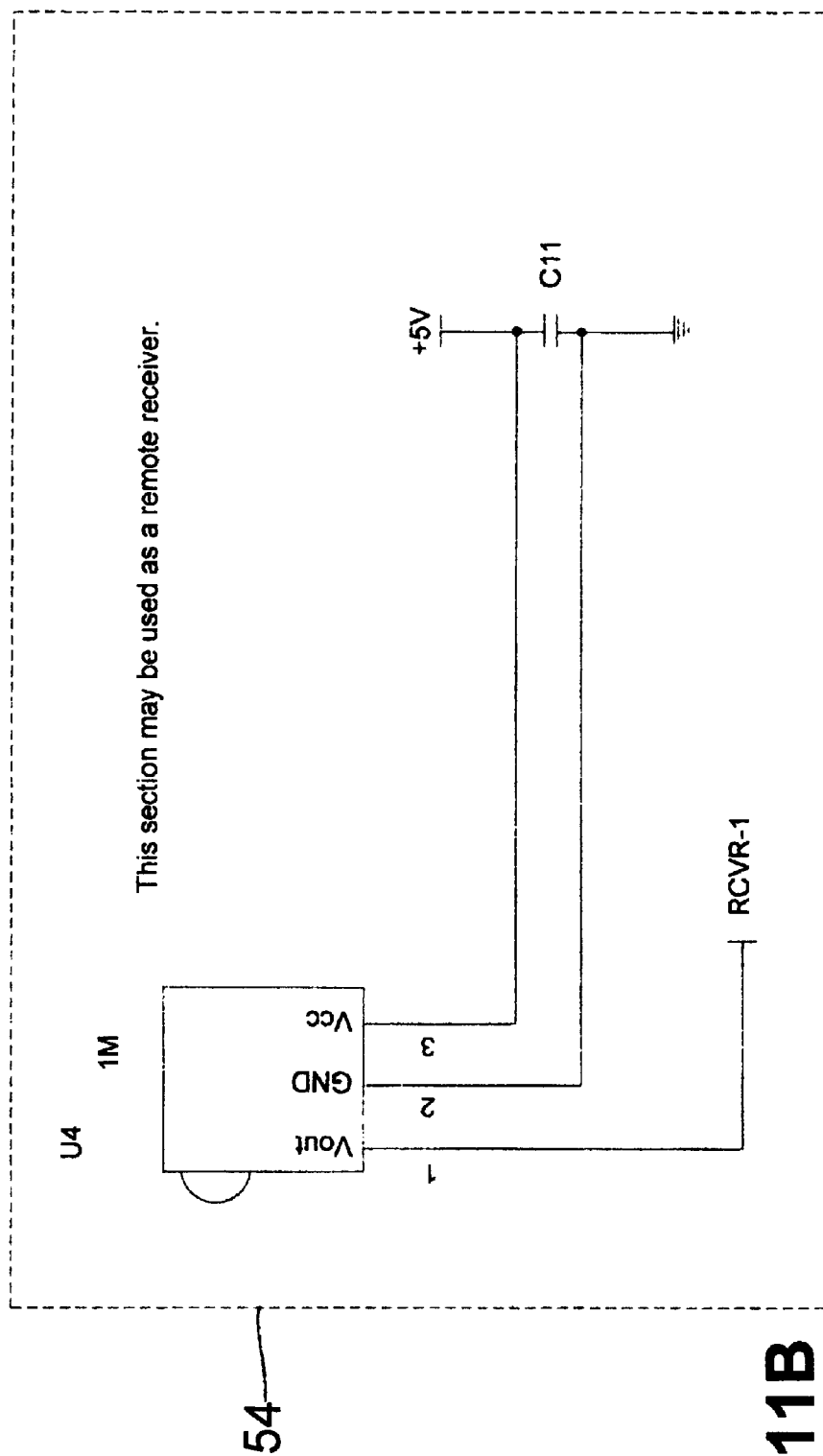
FIG. 11B is a schematic circuit diagram of a receiver circuit for a sensor system in accordance with a preferred embodiment of the present invention.

In the first preferred embodiment of the electronics for a non-contact sensor system 2 depicted in FIGS. 11A–11C, the non-contact sensor system 2 has a control circuit 56, illustrated in FIG. 11C, coupled to the infrared receiver 54, illustrated in FIG. 11B, for receiving the output signal from the infrared receiver 54 and for sending a failure signal to the device 50 only if no infrared signal is received by the infrared receiver 54 for a predetermined time period. The infrared signal, the output signal and the failure signal may all be binary. Further, the output signal may be a series of pulses each having a substantially similar width and a predetermined time between pulses, the pulses being generated only in the presence of the infrared signal being detected by the infrared receiver 54. In the present embodiment the control circuit 56 has a microcontroller U1 which includes at least one input for receiving the output signal from the infrared receiver 54. However, one of ordinary skill in the art would understand that the control circuit 56 may include an application specific integrated circuit (ASIC), a processor, a microprocessor, programmable array logic (PAL), or a combination of hardwired logic gates or the like. The microcontroller U1 in the control circuit 56 has at least one output for sending a failure signal to the device 50 that controls the movement of the door 12. The microcontroller U1 includes a program for counting continuously repeating pulses of the output signal from the infrared receiver 54 until a predetermined number of continuously repeating pulses accumulates and for causing the microcontroller U1 to send the failure signal to the device 50. By counting a number of pulses, the control circuit 56 reduces the possibility of sending out a failure signal based upon a false output signal. Additionally, the infrared transmitter 52 may be set for a gain greater than one so that the transmitted signal is stronger, enabling the non-contact sensor system 2 to detect signals over a greater distance and to compensate for lack of precise alignment between the infrared transmitter 52 and the infrared receiver 54. The non-contact sensor system 2 of the present invention, due to its ability to have an increased gain and error reduction, is not susceptible to problems or false signals due to lack of precise alignment between the infrared transmitter 52 and the infrared receiver 54, noise, transients or other problems.

FIG. 11A is a schematic circuit diagram of a preferred embodiment of a power supply circuit 58, for the present invention. The power supply circuit 58 comprises a voltage regulator IC U5, two Zener diodes D2, D13, a diode bridge rectifier DB1, a power-on light emitting diode (LED) D8, an inductance coil L1, and various biasing components C4, C9, C10, C15, R1, R9. In the present embodiment, the voltage regulator U5 is a National Semiconductor LM78M05C/TO and the diode bridge rectifier DB1 is a Diodes Incorporated™ HD04DICT. A voltage with a potential of between about 7 to about 25 VDC is supplied, from an external power source (not shown), to the diode bridge rectifier DB1 which in conjunction with the Zener diode D2 ensures that a proper polarity voltage is supplied to the input of the voltage regulator IC U5. The voltage regulator IC U5 is capable of regulating an input voltage between about 7 to about 25 VDC to an output voltage between about 4.7 to about 5.3 VDC, but ideally to an output voltage between about 4.8 to about 5.2 VDC with a typical value of 5.0 VDC. Once supplied with a regulated voltage from the voltage regulator IC U5, the LED D8 is illuminated indicating that the circuit has regulated power. The power supply circuit 58 supplies power at a regulated voltage to other devices in the related circuits depicted in FIGS. 11B and 11C, described in detail below. It should be obvious to one skilled in the art to substitute other similar voltage regulators, bridge rectifiers, and the like, having different nominal input and output values without departing from the scope of the invention. In normal operation, power is continuously supplied to the power supply circuit 58, which in turn continuously provides power to the other parts of the circuit through commonly available electrical conductors, wires, jumpers or the like.

FIG. 11B is a schematic circuit diagram of an infrared receiver 54 in accordance with the present embodiment. The infrared receiver 54 is supplied regulated power from the power supply circuit 58 at a voltage regulated between about 4.7 to about 5.3 VDC, but ideally to an output voltage between about 4.8 to about 5.2 VDC with a typical value of 5.0 VDC. Infrared receiver 54 includes an infrared receiver IC U4 and a filtering capacitor C11. The infrared receiver IC U4 in the present embodiment is a Panasonic PNA4611M infrared Photo IC. The combination of the infrared receiver IC U4 and the filtering capacitor C11 provides the capability of detecting a 36.7 kHz modulated infrared signal and outputting a low (zero) output as long as the modulated infrared signal is detected. However, it should be obvious to one skilled in the art to substitute other similar infrared receiver IC's, photo-detector IC's, and the like having the same or different detection frequency capabilities without departing from the scope of the invention. It is desirable to select a receiver that has an extremely tight band-pass filter built into its internal circuitry or associated with it in order to reduce falsely detected occlusions of the signal due to noise. It is also important to select a receiver having a filter that passes signals which closely match the output of the associated infrared transmitter.

FIG. 11C is a schematic circuit diagram of a control circuit 56 in accordance with the present embodiment. The control circuit 56 is supplied regulated power from the power supply circuit 58 at a voltage regulated between about 4.7 to about 5.3 VDC, but ideally to an output voltage between about 4.8 to about 5.2 VDC with a typical value of 5.0 VDC. The control circuit 56 comprises a microcontroller U1, an external clock/crystal CR1, a relay K1, a relay driver transistor Q2, various resistors R2, R5, R11, various capacitors C12, C14 and the infrared transmitter 52. The control circuit 56 also includes two other LED's: one for indicating relay-energized D7 and one for indicating signal-acquired D14. The main logic of the control circuit 56 is provided by the microcontroller U1 which may or may not need to use the external clock/crystal CR1 as a logic time base. The microcontroller U1 in the present embodiment is a Microchip™ PIC16F84/SO microcontroller in combination with an external crystal CR1 modulated at 4 MHz. The particular microcontroller U1 includes on-chip FLASH memory for retaining the controlling programming code without external devices such as electronically programmable read only memory (EPROM's) or electronically erasable programmable read only memory (EEPROM's), or the like, but such devices may be used if desired. The relay K1, in the present embodiment, is a typical single pole single throw (SPST) dry contact type as is commonly known art; however, it would be obvious to one skilled in the art to substitute a variety of similar devices such as silicon controlled rectifiers (SCR's), power transistors, optical isolation devices, solid state switches, radio frequency transmitters, optical transmitters, and the like.

The infrared transmitter 52 includes an infrared transmitter driver transistor Q1, Zener diode D11, infrared LED D4 and biasing resistors R3, R10. In the present embodiment, the infrared LED D4 is a Unitech 1500C4DA-VFL, the infrared transmitter driver transistor Q1 is a 2N7000 transistor, and the Zener diode is a 1N5232. An output of the microcontroller U1 connected to the infrared transmitter 52 is specifically connected to the infrared transmitter driver transistor Q1. The output of the microcontroller U1 connected to the infrared transmitter 52 is driven by the controlling programming in the microcontroller U1 to send the packets of ten voltage pulses. Upon receiving the voltage pulses from the infrared transmitter driver transistor Q1, the infrared LED D4 transmits an infrared signal modulated at between about 20 kHz and 60 kHz but preferably at about 36.7 kHz. However, one of ordinary skill in the art would understand that any of the components could be substituted with other commonly available circuit devices without departing from the spirit of the invention.

Figure 10A:
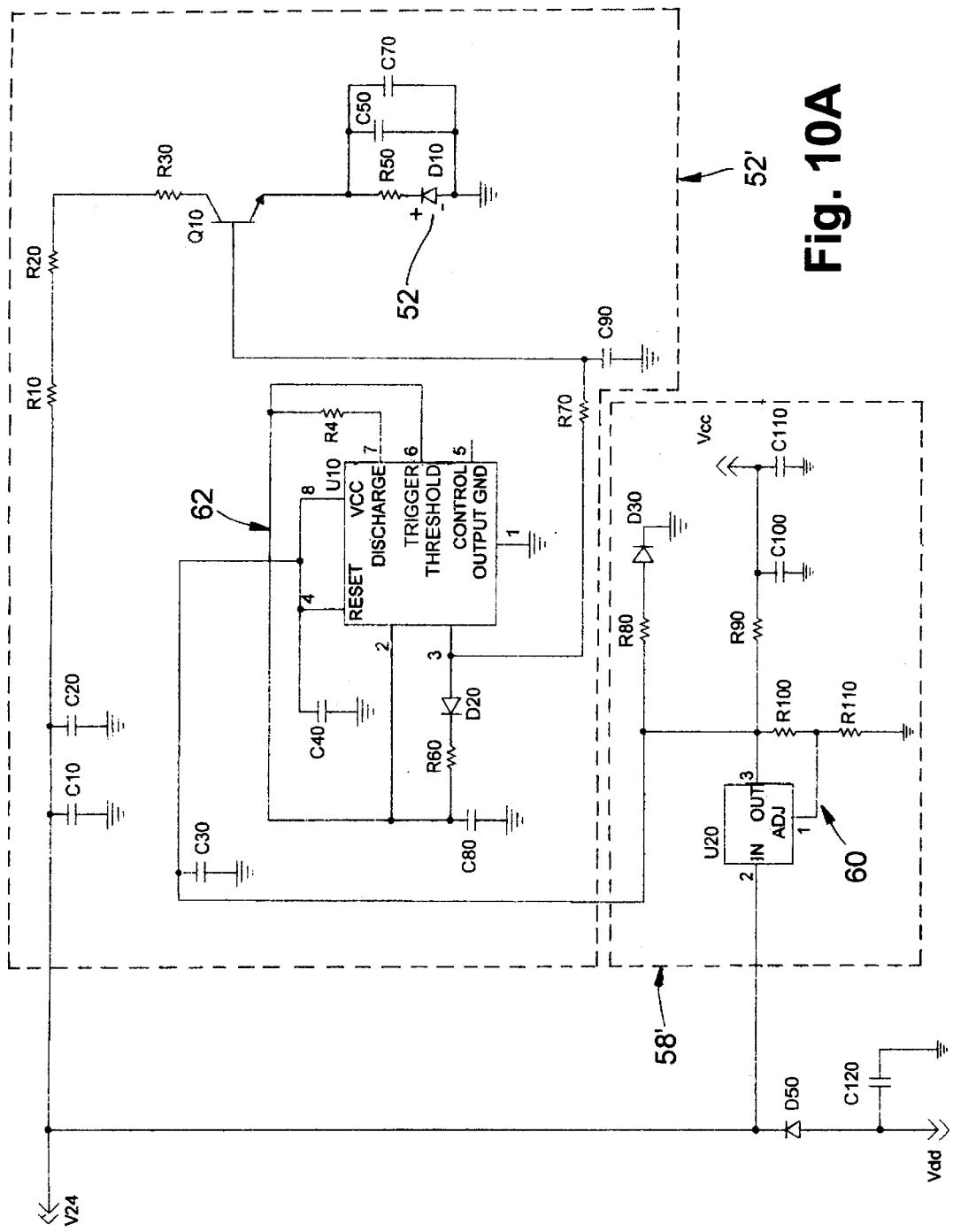
FIG. 10A is a circuit diagram of an alternate embodiment of an infrared transmitter employed in connection with the preferred embodiment of the present invention.

FIG. 10A is a circuit diagram of a second preferred embodiment of a power supply circuitry 58' for an infrared transmitter 52'. The power supply circuitry 58' includes voltage regulator circuitry 60 and a square wave generator circuit 62. The square wave generator circuit 62 is comprised of an integrated circuit U10 and suitable biasing components which are arranged so that the integrated circuit generates an output square wave at a frequency between about five kilohertz (kHz) and about 130 kHz, but preferably at about ten kHz. It will be appreciated by those of ordinary skill in the art that any other suitable frequency could alternatively be employed. The output from the integrated circuit U10 on pin 3 is applied through a smoothing filter R70 and C90 to a switching transistor Q10 which switches on and off at the same frequency. The switching transistor Q10 is connected to an additional smoothing circuit and the infrared light emitting diode (LED) D10.

Figure 10B:
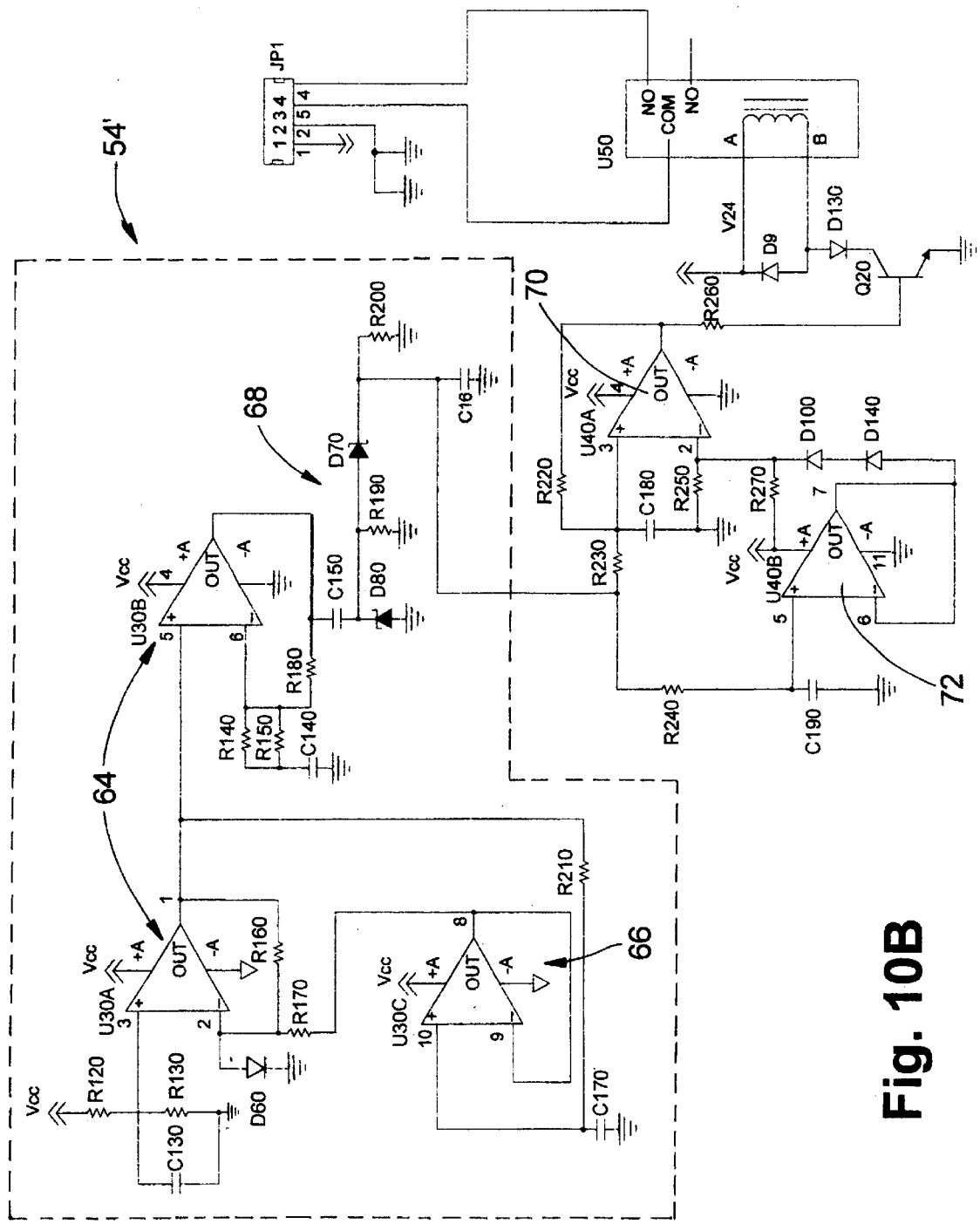
FIG. 10B is a circuit diagram of an infrared receiver employed in connection with the circuit of FIG. 10A.

FIG. 10B is a circuit diagram of a second preferred embodiment of a receiver circuit 54'. The receiver circuit 54' includes a pair of amplifiers 64 and an amplifier filter 66 for receiving electrical signals from an infrared photo diode D60. The amplified signals are then applied to a peak detector which effectively converts the received signals into DC signals. The DC signals are then applied to a comparator 70, the other input of which is provided by a dynamic reference generator 72. As long as the input signal to the comparator 70 is greater than the signal received from the reference generator 72, the output of the comparator 70 remains high. The output from the comparator 70 is applied to a switching transistor Q20, which is connected to the coil of a relay controller. As long as the infrared signal is received by the infrared receiver 54', the output signal from the comparator 70 is high, the transistor Q20 conducts and the coil of the relay functions to permit the door 12 to continue to close. If the infrared signal is blocked by the presence of an object in the path of the downwardly moving door 12, the output of the comparator 70 goes low turning off the transistor Q20 to change the state of the relay and, thereby, cause the door 12 to stop closing or to reverse itself and open. The door controller 50 deactivates the non-contact sensor system as the door gets close (within a few inches) to the surface.

It will be appreciated by those of ordinary skill in the art that other components could alternatively be employed. In addition, it should be clearly understood that the circuitry of FIG. 10A employed for driving the infrared transmitter 52' and the receiver circuitry of FIG. 10B are presented for the purpose of illustrating a first preferred embodiment of the invention and other circuitry could alternatively be employed. In fact, it will be appreciated by those of ordinary skill in the art that some other signal, other than an infrared signal, may alternatively be transmitted and received between the two moveable members 21A, 21B.

From the foregoing, it can be seen that the present invention comprises a non-contact sensor system for a door having a transmitter, a receiver, and a control circuit. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A non-contact sensor system that controls movement of a door moving in a closing direction the sensor system comprising:
    (a) a transmitter extending a first predetermined distance beyond a leading edge of the door at a first door side for transmitting a signal toward a second door side, said transmitter being attached to the door by a first moveable member, said first moveable member being pivotally attached to the leading edge of the door and capable of engaging a surface when the door closes and moving between a first extended position and a first retracted position relative to the leading edge of the door; and
    (b) a receiver extending a second predetermined distance beyond the leading edge of the door at the second door side in relative alignment with the transmitter for detecting the signal and for generating an output signal when the transmitter signal is blocked, said receiver being attached to the door by a second moveable member, said second moveable member being pivotally attached to the leading edge of the door and capable of engaging the surface when the door closes and moving between a second extended position and a second retracted position relative to the leading edge of the door, the output signal being suppressed when the second moveable member is in the second retracted position, wherein said first and second members each pivot toward said first and second retracted positions, respectively, in an area substantially between planes defined by front and back surfaces of the door as the door closes until the first and second moveable members reach the first and second retracted positions, respectively, so as to be parallel and adjacent to the leading edge of the door and each of said first and second members pivot toward the first and second extended positions, respectively, as the door opens.

2. The non-contact sensor system according to claim 1, wherein the predetermined distances are a function of a speed the door is traveling and a stopping distance required to stop the door after the receiver generates the output signal.

3. The non-contact sensor system according to claim 1, wherein the transmitter is a unidirectional transmitter.

4. The non-contact sensor system according to claim 1, wherein the transmitter and the receiver are infrared devices.

5. The non-contact sensor system according to claim 1, wherein the first and second predetermined distances are generally equal.

6. A non-contact sensor system that controls movement of a door moving in a closing direction the sensor system comprising:

(a) a transmitter extending a first predetermined distance beyond a leading edge of the door at a first door side for transmitting a signal toward a second door side, said transmitter being attached to the door by a first moveable member, said first moveable member being formed of a resilient, flexible material and capable of engaging a surface when the door closes and moving between a first extended position and a first retracted position relative to the leading edge of the door; and (b) a receiver extending a second predetermined distance beyond the leading edge of the door at the second door side in relative alignment with the transmitter for detecting the signal and for generating an output signal when the transmitter signal is blocked, said receiver being attached to the door by a second moveable member, said second moveable member being formed of said resilient, flexible material and capable of engaging the surface when the door closes and moving between a second extended position and a second retracted position relative to the leading edge of the door, the output signal being suppressed when the second moveable member is in the second retracted position, wherein the first and second moveable members each fold as the door closes until the first and second moveable members reach the first and second retracted positions, respectively, and each unfolds to the first and second extended positions, respectively, as the door opens.

7. The non-contact sensor system according to claim 6, wherein the predetermined distances are a function of a speed the door is traveling and a stopping distance required to stop the door after the receiver generates the output signal.

8. The non-contact sensor system according to claim 6, wherein the transmitter is a unidirectional transmitter.

9. The non-contact sensor system according to claim 6, wherein the transmitter and the receiver are infrared devices.

10. The non-contact sensor system according to claim 6, wherein the first and second moveable members are parallel with the leading edge of the door.

11. The non-contact sensor system according to claim 6, wherein the first and second predetermined distances are generally equal.

12. A non-contact sensor system that controls movement of a door moving in a closing direction, the sensor system comprising:

(a) a transmitter extending a first predetermined distance beyond a leading edge of the door at a first door side for transmitting a signal toward a second door said, transmitter being attached to the door by a first moveable member, said first moveable member being capable of engaging a surface when the door closes and moving between a first extended position and a first retracted position relative to the leading edge of the door; and (b) a receiver extending a second predetermined distance beyond the leading edge of the door at the second door side in relative alignment with the transmitter for detecting the signal and for generating an output signal when the transmitter signal is blocked, said receiver being attached to the door by a second moveable member, said second moveable member being capable of engaging the surface when the door closes and moving between a second extended position and a second retracted position relative to the leading edge of the door, the output signal being suppressed when the second moveable member is in the second retracted position, wherein the leading edge of the door includes two recesses each proximate a respective one of the first and second door sides and wherein the first and second moveable members each comprise a coil spring housing that bends into a respective one of the recesses the leading edge of the door as the door closes until the first and second moveable members reach the first and second retracted positions, respectively, and each flex to the first and second extended positions, respectively, as the door opens.

13. The non-contact sensor system according claim 12, wherein the predetermined distances are a function of a speed the door is traveling and a stopping distance required to stop the door after the receiver generates the output signal.

14. The non-contact sensor system according to claim 12, wherein the transmitter is a unidirectional transmitter.

15. The non-contact sensor system according to claim 12, wherein the transmitter and the receiver are infrared devices.

16. The non-contact sensor system according to claim 12, wherein the first and second moveable members extend parallel with the leading edge of the door when in the first and second retracted positions, respectively.

17. The non-contact sensor system according to claim 12, wherein the first and second predetermined distances are generally equal.

* * * * *